United States Patent
Kennedy et al.

(10) Patent No.: US 8,080,107 B2
(45) Date of Patent: *Dec. 20, 2011

(54) SHOWERHEAD ELECTRODE ASSEMBLY FOR PLASMA PROCESSING APPARATUSES

(75) Inventors: William S. Kennedy, Fremont, CA (US); David E. Jacob, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 39 days.

This patent is subject to a terminal disclaimer.

(21) Appl. No.: 12/625,215

(22) Filed: Nov. 24, 2009

(65) Prior Publication Data

US 2010/0065214 A1   Mar. 18, 2010

Related U.S. Application Data

(62) Division of application No. 10/743,062, filed on Dec. 23, 2003, now Pat. No. 7,645,341.

(51) Int. Cl.
| | |
|---|---|
| C23C 16/00 | (2006.01) |
| C23C 16/455 | (2006.01) |
| C23C 16/50 | (2006.01) |
| H01L 21/3065 | (2006.01) |

(52) U.S. Cl. .............. 118/715; 118/724; 118/723 E; 156/345.33; 156/345.34; 156/345.43; 156/345.47

(58) Field of Classification Search .............. 118/715, 118/723 E, 724; 156/345.33, 345.34, 345.43, 156/345.47; 427/569; 438/584, 689, 710; 216/67
See application file for complete search history.

(56) References Cited

U.S. PATENT DOCUMENTS

| | | | |
|---|---|---|---|
| 3,448,352 A | 6/1969 | Ferree | |
| 5,534,751 A | 7/1996 | Lenz et al. | |
| 5,569,356 A | 10/1996 | Lenz et al. | |
| 5,653,808 A | 8/1997 | MacLeish et al. | |
| 5,766,364 A | 6/1998 | Ishida et al. | |
| 5,882,411 A | 3/1999 | Zhao et al. | |
| 5,950,925 A | 9/1999 | Fukunaga et al. | |
| 5,964,947 A | 10/1999 | Zhao et al. | |
| 5,977,552 A | 11/1999 | Foad | |
| 6,036,782 A | 3/2000 | Tanaka et al. | |

(Continued)

FOREIGN PATENT DOCUMENTS

JP   01160864 A   6/1989

(Continued)

OTHER PUBLICATIONS

International Search Report and Written Opinion mailed Mar. 2, 2006 for PCT/US04/42100.

(Continued)

*Primary Examiner* — Jeffrie R Lund

(74) *Attorney, Agent, or Firm* — Buchanan Ingersoll & Rooney PC

(57) ABSTRACT

A showerhead electrode assembly of a plasma processing apparatus includes a thermal control plate attached to a showerhead electrode, and a top plate attached to the thermal control plate. At least one thermal bridge is provided between opposed surfaces of the thermal control plate and the top plate to allow electrical and thermal conduction between the thermal control plate and top plate. A lubricating material between the thermal bridge and the top plate minimizes galling of opposed metal surfaces due to differential thermal expansion between the top plate and thermal control plate. A heater supported by the thermal control plate cooperates with the temperature controlled top plate to maintain the showerhead electrode at a desired temperature.

13 Claims, 3 Drawing Sheets

U.S. PATENT DOCUMENTS

| | | | |
|---|---|---|---|
| 6,050,216 | A | 4/2000 | Szapucki et al. |
| 6,073,577 | A | 6/2000 | Lilleland et al. |
| 6,079,356 | A | 6/2000 | Umotoy et al. |
| 6,095,083 | A | 8/2000 | Rice et al. |
| 6,123,775 | A | 9/2000 | Hao et al. |
| 6,129,808 | A | 10/2000 | Wicker et al. |
| 6,136,128 | A | 10/2000 | Chung |
| 6,170,429 | B1 | 1/2001 | Schoepp et al. |
| 6,173,673 | B1 | 1/2001 | Golovato et al. |
| 6,194,037 | B1 | 2/2001 | Terasaki et al. |
| 6,194,322 | B1 | 2/2001 | Lilleland et al. |
| 6,237,528 | B1 | 5/2001 | Szapucki et al. |
| 6,245,192 | B1 | 6/2001 | Dhindsa et al. |
| 6,254,993 | B1 | 7/2001 | Mercuri |
| 6,280,584 | B1 | 8/2001 | Kumar et al. |
| 6,286,451 | B1 | 9/2001 | Ishikawa et al. |
| 6,363,624 | B1 | 4/2002 | Pang et al. |
| 6,376,385 | B2 | 4/2002 | Lilleland et al. |
| 6,391,787 | B1 | 5/2002 | Dhindsa et al. |
| 6,408,786 | B1 | 6/2002 | Kennedy et al. |
| 6,415,736 | B1 | 7/2002 | Hao et al. |
| 6,432,831 | B2 | 8/2002 | Dhindsa et al. |
| 6,433,314 | B1 | 8/2002 | Mandrekar et al. |
| 6,451,157 | B1 | 9/2002 | Hubacek |
| 6,454,898 | B1 | 9/2002 | Collins et al. |
| 6,473,993 | B1 | 11/2002 | Yagi et al. |
| 6,477,980 | B1 | 11/2002 | White et al. |
| 6,583,064 | B2 | 6/2003 | Wicker et al. |
| 6,786,175 | B2 | 9/2004 | Dhindsa et al. |
| 6,818,096 | B2 | 11/2004 | Barnes et al. |
| 7,543,547 | B1 | 6/2009 | Kennedy et al. |
| 7,645,341 | B2 * | 1/2010 | Kennedy et al. ............... 118/715 |
| 7,862,682 | B2 * | 1/2011 | Stevenson et al. ....... 156/345.34 |
| 2001/0004879 | A1 | 6/2001 | Umotoy et al. |
| 2001/0027026 | A1 | 10/2001 | Dhindsa et al. |
| 2002/0069968 | A1 | 6/2002 | Keller et al. |
| 2002/0088111 | A1 | 7/2002 | Von Arx et al. |
| 2002/0150519 | A1 | 10/2002 | Barnes et al. |
| 2003/0029569 | A1 | 2/2003 | Natsuhara et al. |
| 2003/0054099 | A1 | 3/2003 | Jurgensen et al. |
| 2003/0102304 | A1 | 6/2003 | Boyers |
| 2003/0138560 | A1 | 7/2003 | Zhao et al. |
| 2003/0205202 | A1 | 11/2003 | Funaki et al. |
| 2005/0133160 | A1 | 6/2005 | Kennedy et al. |
| 2007/0068629 | A1 | 3/2007 | Shih et al. |
| 2007/0235660 | A1 | 10/2007 | Hudson |
| 2008/0087641 | A1 | 4/2008 | de la Llera et al. |
| 2008/0090417 | A1 | 4/2008 | de la Llera et al. |
| 2008/0141941 | A1 | 6/2008 | Augustino et al. |
| 2008/0308228 | A1 | 12/2008 | Stevenson et al. |
| 2009/0081878 | A1 | 3/2009 | Dhindsa |
| 2009/0111276 | A1 | 4/2009 | Dhindsa et al. |
| 2009/0127234 | A1 | 5/2009 | Larson et al. |
| 2009/0163034 | A1 | 6/2009 | Larson et al. |
| 2009/0211085 | A1 | 8/2009 | Kennedy et al. |
| 2009/0305509 | A1 * | 12/2009 | Stevenson et al. ............. 438/710 |
| 2010/0003824 | A1 * | 1/2010 | Kadkhodayan et al. ...... 438/710 |
| 2010/0003829 | A1 * | 1/2010 | Patrick et al. .................. 438/758 |
| 2010/0065214 | A1 * | 3/2010 | Kennedy et al. ......... 156/345.34 |
| 2010/0184298 | A1 * | 7/2010 | Dhindsa ......................... 438/710 |
| 2010/0261354 | A1 * | 10/2010 | Bettencourt et al. .......... 438/710 |
| 2011/0070740 | A1 * | 3/2011 | Bettencourt et al. .......... 438/710 |
| 2011/0081783 | A1 * | 4/2011 | Stevenson et al. ............ 438/710 |

FOREIGN PATENT DOCUMENTS

JP        H10-172719        6/1998

OTHER PUBLICATIONS

International Preliminary Report on Patentability mailed Jul. 6, 2006 for PCT/US2004/042100.

Japanese Official Action mailed Nov. 22, 2010 for Japanese Patent Appln. No. 2006-547131.

* cited by examiner

US 8,080,107 B2

SHOWERHEAD ELECTRODE ASSEMBLY FOR PLASMA PROCESSING APPARATUSES

CROSS-REFERENCE TO RELATED APPLICATIONS

This application is a divisional application of U.S. application Ser. No. 10/743,062 entitled SHOWERHEAD ELECTRODE ASSEMBLY FOR PLASMA PROCESSING APPARATUSES, filed on Dec. 23, 2003 now U.S. Pat. No. 7,645,341, the entire content of which is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

SUMMARY

A showerhead electrode assembly of a semiconductor substrate processing apparatus, and a thermal control plate for supporting a showerhead electrode in a semiconductor substrate processing chamber are provided.

A preferred embodiment of a thermal control plate for supporting a showerhead electrode in a semiconductor substrate processing chamber comprises a metal outer portion removably attachable to a temperature-controlled top plate; and a metal inner portion removably attachable to the showerhead electrode and the top plate. The inner portion of the thermal control plate provides a thermal and electrical path between the top plate and showerhead electrode.

A preferred embodiment of the showerhead electrode assembly for a plasma processing apparatus comprises a top plate, a showerhead electrode, and a thermal control plate. The thermal control plate is attached to the showerhead electrode and the top plate such that a central portion of the thermal control plate is movable relative to the top plate. At least one thermal bridge is provided between the central portion of the thermal control plate and the top plate. The thermal bridge provides a thermal and electrical path between the showerhead electrode and the top plate.

The thermal bridge preferably includes a lubricating material to permit sliding, as well as provide thermal and electrical conduction, between opposed surfaces of the thermal control plate and the top plate.

Another preferred embodiment provides a method of processing a semiconductor substrate in a semiconductor substrate processing chamber, which comprises (a) placing a substrate on a substrate support, which includes a bottom electrode, in a plasma chamber of a semiconductor substrate processing apparatus; (b) supplying a process gas into the plasma chamber with a showerhead electrode assembly according to a preferred embodiment; (c) generating a plasma from the process gas in the plasma chamber between the showerhead electrode assembly and the substrate; (d) processing the substrate with the plasma; (e) terminating the generation of the plasma; and (f) removing the substrate from the plasma chamber. The showerhead electrode assembly preferably comprises a heater. In another preferred embodiment, the method comprises activating the heater after (e) to apply heat to the showerhead electrode to maintain the showerhead electrode at a desired temperature, and/or activating the heater to apply heat to the showerhead electrode during (a) to (f).

BRIEF DESCRIPTION OF THE DRAWING FIGURES

DETAILED DESCRIPTION

Figure 1:
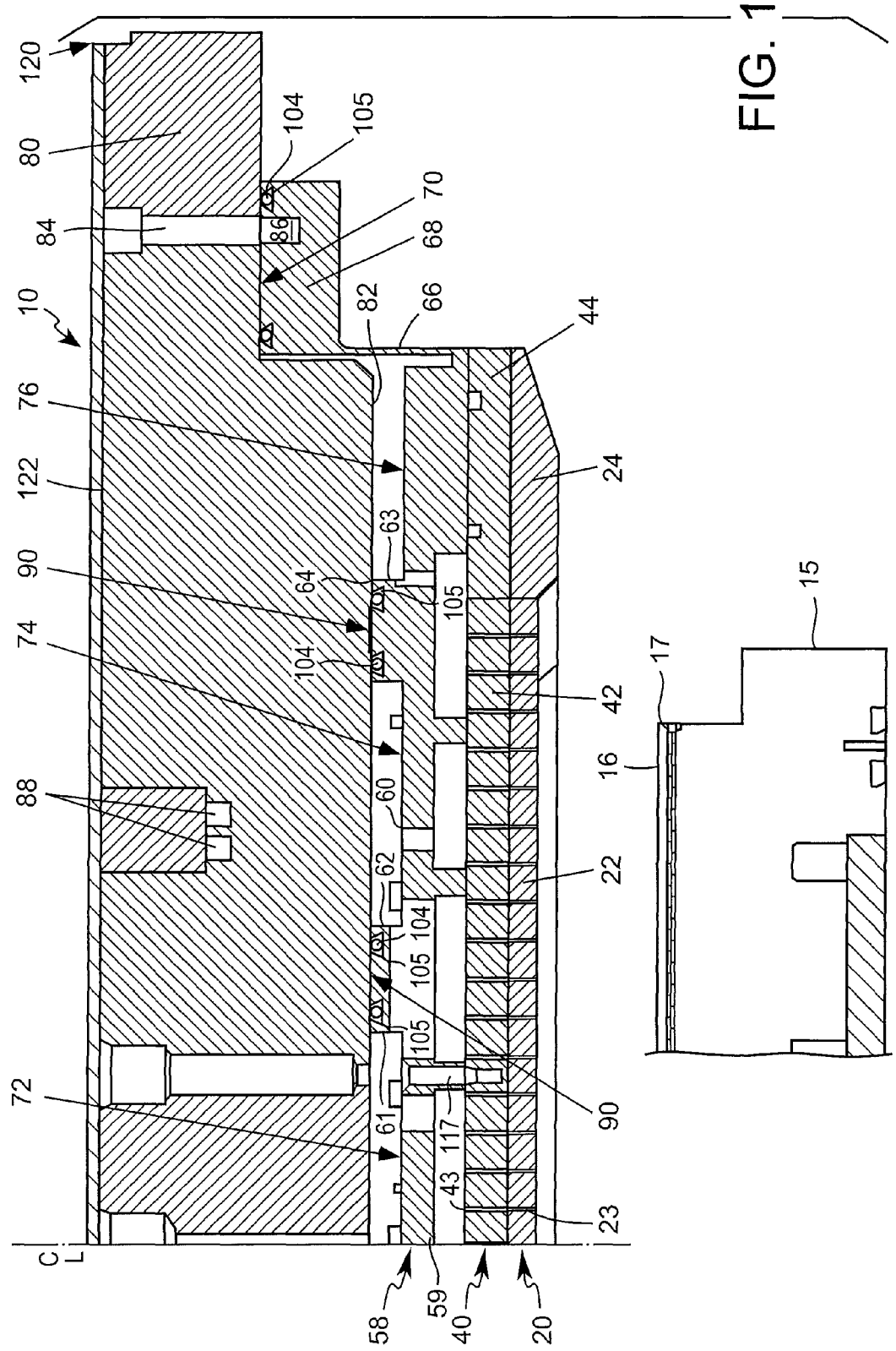
FIG. 1 illustrates a portion of a preferred embodiment of a showerhead electrode assembly and a substrate support for a plasma processing apparatus.

FIG. 1 illustrates a preferred embodiment of a showerhead electrode assembly 10 for a plasma processing apparatus in which semiconductor substrates, e.g., silicon wafers, are processed. The showerhead electrode assembly 10 (only one-half of which is shown in FIG. 1) comprises a showerhead electrode including a top electrode 20 and an optional backing member 40 secured to the top electrode 20, a thermal control plate 58, and a top plate 80. The top plate 80 can form a removable top wall of the plasma processing apparatus, such as a plasma etch chamber.

A substrate support 15 (only a portion of which is shown in FIG. 1) including a bottom electrode and optional electrostatic clamping electrode is positioned beneath the top electrode 20 in the vacuum processing chamber of the plasma processing apparatus. A substrate 16 subjected to plasma processing is mechanically or electrostatically clamped on an upper support surface 17 of the substrate support 15.

The top electrode 20 of the showerhead electrode preferably includes an inner electrode member 22, and an optional outer electrode member 24. The inner electrode member 22 is preferably a cylindrical plate (e.g., single crystal silicon). The inner electrode member 22 can have a diameter smaller than, equal to, or larger than a wafer to be processed, e.g., up to 12 inches (300 mm) if the plate is made of single crystal silicon, which is the maximum diameter of currently available single crystal silicon material. For processing 300 mm wafers, the outer electrode member 24 is provided to expand the diameter of the top electrode 20 from about 15 inches to about 17 inches. The outer electrode member 24 can be a continuous member (e.g., a poly-silicon member, such as a ring), or a segmented member (e.g., 2-6 separate segments arranged in a ring configuration, such as segments of single crystal silicon). In embodiments of the top electrode 20 that include a multiple-segment outer electrode member 24, the segments preferably have edges which overlap each other to protect an underlying bonding material from exposure to plasma. The inner electrode member 22 preferably includes multiple gas passages 23 for injecting a process gas into a space in a plasma reaction chamber between the top electrode 20 and bottom electrode 15.

Single crystal silicon is a preferred material for plasma exposed surfaces of the inner electrode member 22 and the outer electrode member 24. High-purity, single crystal silicon minimizes contamination of substrates during plasma processing as it introduces only a minimal amount of undesirable elements into the reaction chamber, and also wears smoothly during plasma processing, thereby minimizing particles.

Alternative materials that can be used for plasma-exposed surfaces of the top electrode 20 include SiC, SiN, AlN, and $Al_2O_3$, for example.

In a preferred embodiment, the showerhead electrode assembly 10 is large enough for processing large substrates, such as semiconductor wafers having a diameter of 300 mm. For 300 mm wafers, the top electrode 20 is at least 300 mm in diameter. However, the showerhead electrode assembly can be sized to process other wafer sizes or substrates having a non-circular configuration.

The backing member 40 preferably includes a backing plate 42 and a backing ring 44. In such embodiments, the inner electrode member 22 is co-extensive with the backing plate 42, and the outer electrode member 24 is co-extensive with the surrounding backing ring 44. However, the backing plate 42 can extend beyond the inner electrode member such that a single backing plate can be used to support the inner electrode member and the segmented outer electrode member. The inner electrode member 22 and the outer electrode member 24 are preferably attached to the backing member 40 by a bonding material, such as an elastomeric bonding material. The backing plate 42 includes gas passages 43 aligned with the gas passages 23 in the inner electrode member 22 to provide gas flow into the plasma processing chamber. The gas passages 43 can typically have a diameter of about 0.04 inch, and the gas passages 23 can typically have a diameter of about 0.025 inch.

The backing plate 42 and backing ring 44 are preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing member 40 include, but are not limited to, graphite and SiC.

The top electrode 20 can be attached to the backing plate 42 and backing ring 44 with a thermally and electrically conductive elastomer bonding material that accommodates thermal stresses, and transfers heat and electrical energy between the top electrode 20 and the backing plate 42 and backing ring 44. The use of elastomers for bonding together surfaces of an electrode assembly is described, for example, in commonly-owned U.S. Pat. No. 6,073,577, which is incorporated herein by reference in its entirety.

The backing plate 42 and the backing ring 44 are preferably attached to the thermal control plate 58 with suitable fasteners, which can be threaded bolts, screws, or the like. For example, bolts (not shown) can be inserted in holes in the thermal control plate 58 and screwed into threaded openings in the backing member 40.

Figure 2:
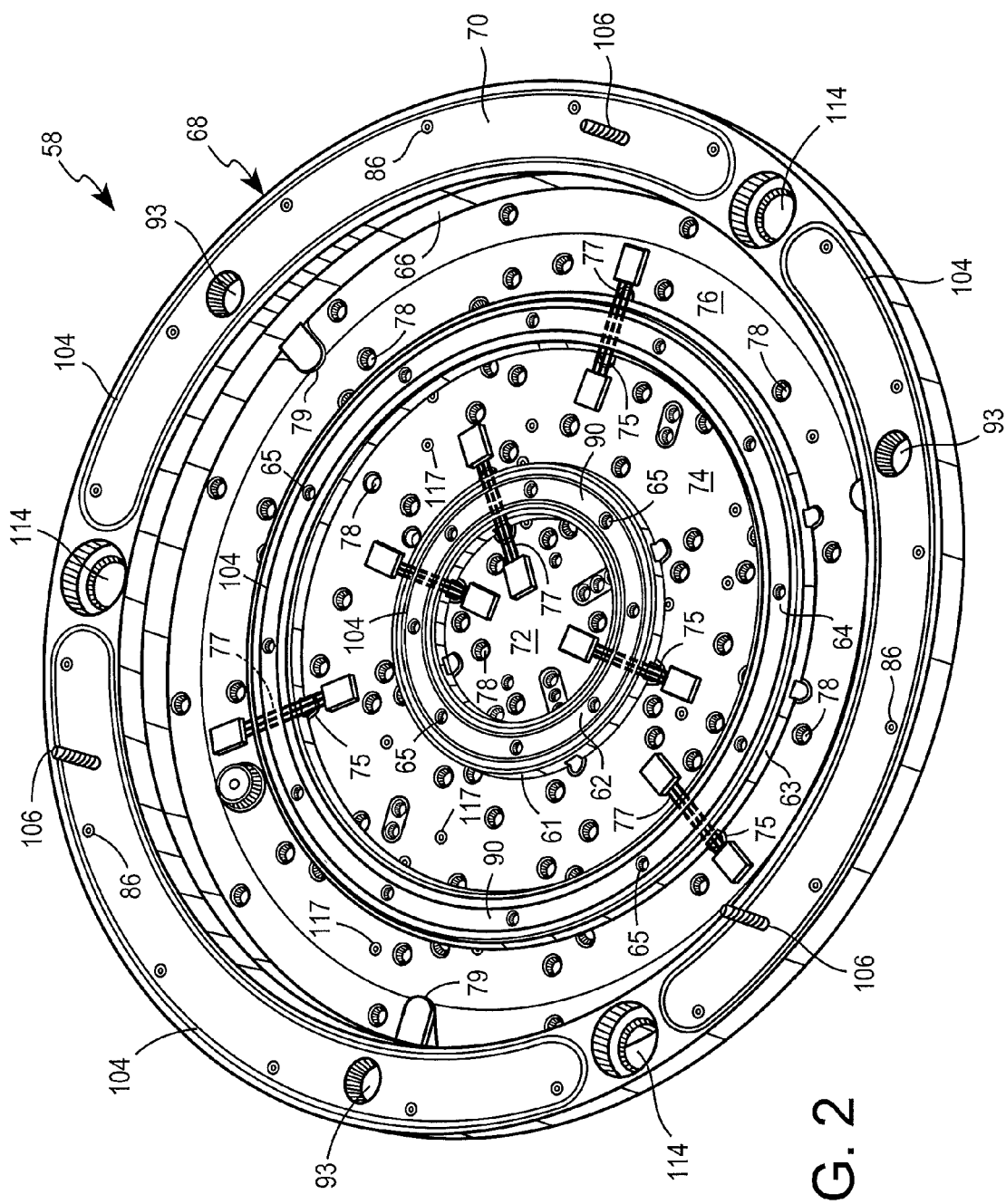
FIG. 2 is a top perspective view of a preferred embodiment of a showerhead electrode assembly without the top plate.

Referring to FIG. 1 and FIG. 2, the thermal control plate 58 comprises a metallic inner portion including a contoured plate 59 with an upper surface 60, and a first projection 61 having an first heat transfer surface 62 and a second projection 63 having a second heat transfer surface 64 on the upper surface. In other preferred embodiments, the thermal control plate 58 can include more than two projections, e.g., three or more projections. The thermal control plate 58 is attached to the top plate 80 with fasteners that extend through oversized openings (not shown) in the top plate and into threaded openings 65 in the surface 62 of the first projection 61 and surface 64 of the second projection 63 (FIG. 2). The thermal control plate 58 also includes threaded openings 117 to receive fasteners to removably attach the thermal control plate 58 to the backing plate 42. The oversized openings in the top plate 80 provide clearances around the fasteners so that the thermal control plate 58 can slide relative to the top plate to accommodate mismatch in thermal expansion of the thermal control plate relative to the top plate.

The thermal control plate 58 also includes a flexure portion 66 connecting the inner portion to an outer portion and including a flange 68 having an upper surface 70 which is held against an opposed surface of top plate 80. The first heat transfer surface 62 and second heat transfer surface 64 preferably have an annular configuration. The first projection 61 and the second projection 63 preferably have a height of from about 0.25 inch to about 0.75 inch, and a width of from about 0.75 inch to about 1.25 inch. However, the first projection 61 and/or second projection 63 can have a non-annular configuration, e.g., arcuate segment, polyhedral, round, oval or other configuration.

The thermal control plate 58 is preferably made of a metallic material, such as aluminum, an aluminum alloy, or the like. The thermal control plate 58 is preferably a machined piece of the metallic material, such as aluminum or aluminum alloy. The top plate 80 is preferably made of aluminum or an aluminum alloy. The top plate 80 preferably includes one or more flow passages 88 through which a temperature-controlled fluid, preferably a liquid, can be circulated to maintain the top plate at a desired temperature.

During processing of a semiconductor substrate in the processing chamber, heat is transferred from the inner electrode member 22 and the outer electrode member 24 and the backing plate 42 and backing ring 44 to the lower surface 82 of the top plate 80 via thermal conduction from the first heat transfer surface 62, second heat transfer surface 64, and through upper surface 70. In other words, the first projection 61 and second projection 63 also provide thermal bridges between the inner electrode member 22, outer electrode member 24, backing plate 42 and backing ring 44 to the top plate 80. This enhanced heat transfer at spaced locations across the thermal control plate 58 can achieve a substantially uniform temperature distribution radially across the top electrode 20.

During operation of the showerhead electrode assembly 10, the thermal control plate 58 and the top plate 80 become heated and thermally expand. As a result, the top plate 80 and thermal control plate 58 can slide relative to each other. This sliding can gall surfaces of the top plate 80 and/or thermal control plate 58 (e.g., one or more surfaces of a central portion of the thermal control plate 58) that contact each other and cause particles, such as aluminum particles, to be dislodged from the contact surfaces. The loose particles may contaminate substrates in the reaction chamber and thereby reduce process yields.

It has been determined that galling of opposed surfaces of the top plate 80 and/or the thermal control plate 58 can be minimized by placing a material that has lubricity between the opposed surfaces. In a preferred embodiment, at least one layer of a lubricating material 90 is placed between the first heat transfer surface 62 and the second heat transfer surface 64 of the thermal control plate 58 and the lower surface 82 of the top plate 80.

The lubricating material 90 has sufficient thermal and electrical conductivity to provide for sufficient heat transfer and electrical conduction from the first heat transfer surface 62 and second heat transfer surface 64 to the top plate 80. A preferred material that provides these properties is an elastically deformable graphite material, such as "GRAFOIL," which is commercially available from UCAR Carbon Co., Inc., Cleveland, Ohio. The lubricating material 90 is preferably a gasket having a preferred thickness of about 0.010 inch to about 0.030 inch, and more preferably about 0.015 inch. The lubricating material 90 is preferably a ring shaped gasket, with each gasket being retained in a respective annular recess formed on each of the first heat surface 62 and second heat transfer surface 64.

The lubricating material 90 is preferably protected from plasma exposure in the reaction chamber. In a preferred embodiment, the lubricating material 90 is disposed between vacuum seals, e.g., a pair of optional O-rings 104 retained in spaced-apart annular grooves 105 in the first heat transfer surface 62 and the second heat transfer surface 64 of the thermal control plate 58. The O-rings 104 isolate the lubricating material 90 from the vacuum environment in the plasma chamber and thereby protect the lubricating material from plasma exposure. The first heat transfer surface 62 and the second heat transfer surface 64 preferably are spaced from the lower surface 82 of the top plate 80 by the lubricating material 90 by a sufficient distance so that there is no metal-to-metal sliding contact along the first heat transfer surface 62 or the second heat transfer surface 64.

The thermal control plate 58 preferably includes at least one heater operable to cooperate with the temperature-controlled top plate 80 to control the temperature of the top electrode 20. For example, in a preferred embodiment, the heater is provided on the upper surface of the thermal control plate 58 and includes a first heater zone 72 surrounded by the first projection 61, a second heater zone 74 between the first projection 61 and the second projection 63, and a third heater zone 76 between the second projection 63 and the flexure portion 66. The number of heater zones can be varied; for example, in other embodiments the heater can include a single heater zone, two heater zones, or more than three heater zones. The heater can alternatively be provided on a bottom surface of the thermal control plate 58.

The heater preferably comprises a laminate including a resistively heated material disposed between opposed layers of a polymeric material that can withstand the operating temperatures reached by the heater. An exemplary polymeric material that can be used is a polyimide sold under the trademark Kapton®, which is commercially available from E.I. du Pont de Nemours and Company. Alternatively, the heater can be a resistive heater embedded in the thermal control plate (e.g., a heating element in a cast thermal control plate or a heating element located in a channel formed in the thermal control plate). Another embodiment of the heater includes a resistive heating element mounted on the upper and/or lower surface of the thermal control plate. Heating of the thermal control plate can be achieved via conduction and/or radiation.

The heater material can have any suitable pattern that provides for thermally uniform heating of the first heater zone 72, second heater zone 74, and third heater zone 76. For example, the laminate heater can have a regular or non-regular pattern of resistive heating lines such as a zig-zag, serpentine, or concentric pattern. By heating the thermal control plate 58 with the heater, in cooperation with operation of the temperature-controlled top plate 80, a desirable temperature distribution can be provided across the top electrode 20 during operation of the showerhead electrode assembly 10.

The heater sections located in the first heater zone 72, second heater zone 74, and third heater zone 76 can be secured to the thermal control plate 58 by any suitable technique, e.g., the application of heat and pressure, adhesive, fasteners, or the like.

In a preferred embodiment, the first heater zone 72, second heater zone 74, and third heater zone 76 are electrically interconnected in series via electrical connectors 77. In a preferred embodiment, the heater comprises three circuits including a first resistive heated conductor adapted to receive AC current at a first phase, a second resistive heated conductor adapted to receive AC current at a second phase, and a third resistive heated conductor adapted to receive AC current at a third phase, wherein the first, second and third phases are 120° out of phase with each other.

Figure 3:
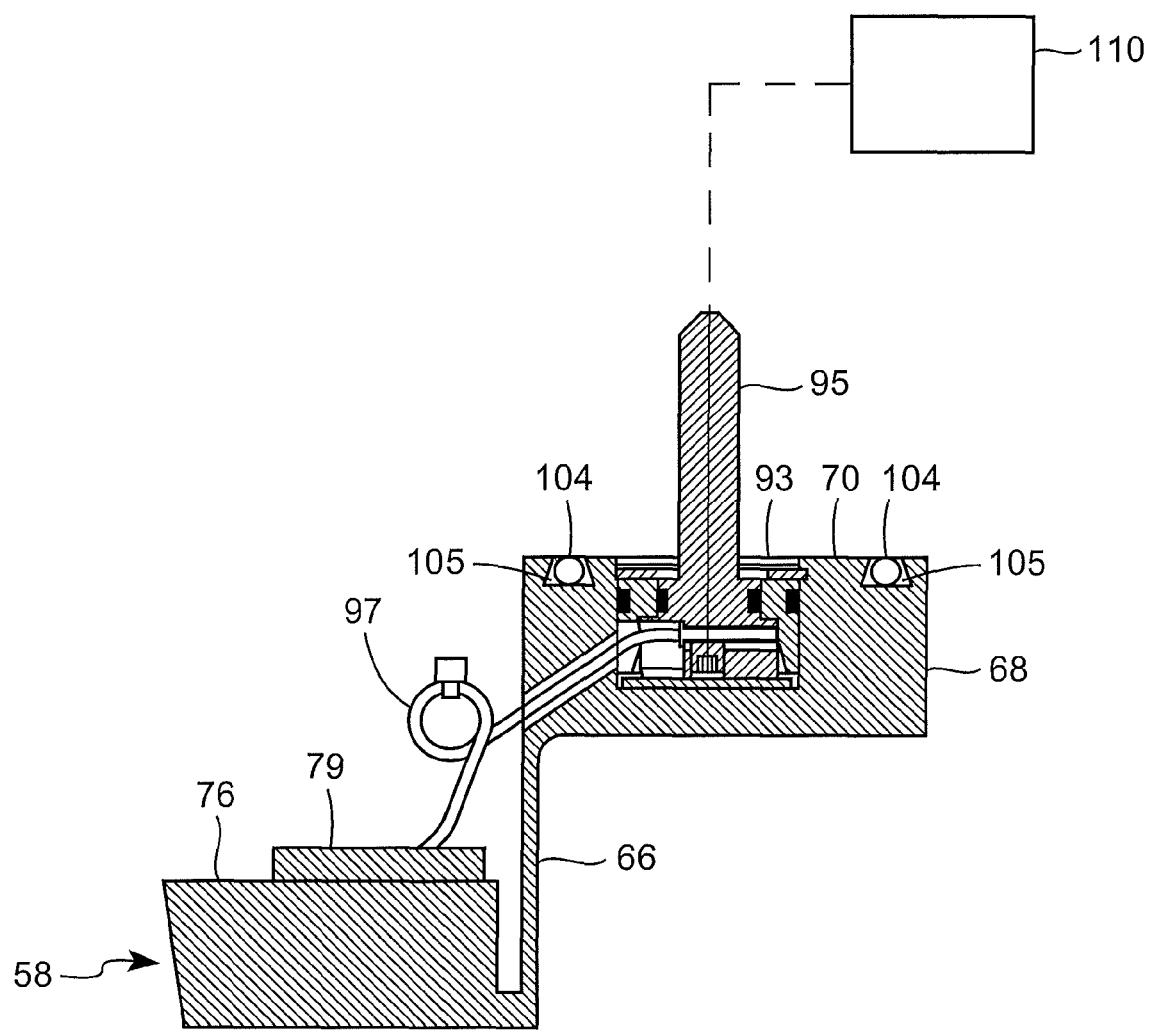
FIG. 3 illustrates an exemplary electrical connection between a power supply and a heater of the showerhead electrode assembly.

As shown in FIG. 3, the heater can receive power from a single power supply 110. In a preferred embodiment, the power supply 110 is electrically connected to three circumferentially spaced posts, such as posts 95, received in openings 93 in the flange 68 of the thermal control plate 58. The posts 95 are each connected to an electrical conductor 97, which extends through the flange 68 to a boot 79, and electrically contacts a respective phase of the three-phase heater located in the third heater zone 76. The three phases of the third heater 76 are electrically connected to the three corresponding phases of the second heater via connections 77 and the three phases of the second heater are electrically connected to the three phases of the first heater by connections 77.

The thermal control plate 58 preferably includes lateral gas passages 75 to allow process gas flow laterally from a plenum above the first heater zone 72 to a plenum above the second heater zone 74, and from the plenum above the second heater zone 74 to a plenum above the third heater zone 76. In a preferred embodiment, a plurality of gas passages 75 extend through the first projection 61 and second projection 63. The gas passages 75 are sized to allow the electrical connectors 77 to extend through the gas passages 75 to electrically connect the first heater zone 72, second heater zone 74 and third heater zone 76. The gas passages 75 are preferably large enough to allow the process gas to be distributed over the upper surface of the thermal control plate 58 so as to provide a substantially uniform pressure distribution of gas passing through openings 78 communicating with plenums between the thermal control plate and the backing member 40.

The top electrode 20 can be electrically grounded, or alternatively can be powered, preferably by a radio-frequency (RF) current source. In a preferred embodiment, the top electrode 20 is grounded, and power at one or more frequencies is applied to the bottom electrode to generate plasma in the plasma processing chamber. For example, the bottom electrode can be powered at frequencies of 2 MHz and 27 MHz by two independently controlled radio frequency power sources. After a substrate has been processed (e.g., a semiconductor substrate has been plasma etched), the supply of power to the bottom electrode is shut off to terminate plasma generation. The processed substrate is removed from the plasma processing chamber, and another substrate is placed on the substrate support 15 for plasma processing. In a preferred embodiment, the heater is activated to heat the thermal control plate 58 and, in turn, the top electrode 20, when power to the bottom electrode is shut off. As a result, the top electrode 20 temperature is preferably prevented from decreasing below a desired minimum temperature. The top electrode 20 temperature is preferably maintained at approximately a constant temperature between successive substrate processing runs so that substrates are processed more uniformly, thereby improving process yields. The power supply 110 preferably is controllable to supply power at a desired level and rate to the heater based on the actual temperature and the desired temperature of the top electrode 20.

The showerhead electrode assembly 10 can include one or more temperature sensors, such as thermocouples, to monitor the top electrode 20 temperature. The temperature sensors are preferably monitored by a controller which controls supply of power from the power supply 110 to the heater. When data provided by the temperature sensors indicates that the top electrode 20 temperature is below a predetermined temperature, the power supply 110 can be activated by the controller to supply power to the heater so as to maintain the top electrode 20 at or above a predetermined temperature.

The heater can also be activated during plasma processing of substrates, i.e., when plasma is being generated between the showerhead electrode assembly 10 and the bottom electrode. For example, during plasma processing operations that utilize relatively low levels of applied power to generate a plasma, the heater can be activated to maintain the temperature of the top electrode 20 within a desired temperature range. During other plasma processing operations that utilize relatively high power levels, such as dielectric material etch processes, the top electrode 20 temperature typically remains sufficiently high between successive runs so that the heater does not need to be activated to prevent the top electrode from falling below a minimum temperature.

In the embodiment shown in FIG. 3, the flexure portion 66 of the thermal control plate 58 comprises a cylindrical wall extending to the flange 68. The flange 68 is attached to the top plate 80, such as by fasteners (e.g., threaded bolts, screws, or the like) inserted into aligned openings 84, 86 in the top plate 80 and flange 68, respectively (FIG. 1). The flange 68 preferably has an annular configuration. The flexure portion 66 has a configuration that can accommodate thermal expansion and contraction of the thermal control plate 58 relative to the top plate 80. Namely, the flexure portion 66 preferably has a length to thickness ratio that is optimized to accommodate lateral and axial movements between the central portions of the top plate 80 and thermal control plate 58 and prevent associated damage to the thermal control plate 58. During lateral sliding movement, the lubricating material 90 prevents galling of the heat transfer surfaces 62 and 64 of the thermal control plate 58, and the lower surface 82 of the top plate 80. By providing the flexure portion 66, a lubricating material can be omitted between the top surface 70 of the flange 68 and the lower surface 82 of the top plate 80.

The thermal control plate 58 is removably attached to the top plate 80 with suitable fasteners, which extend through the openings 84 in the top plate 80 and into the openings 86 formed in the flange 68. In one embodiment, the showerhead electrode assembly 10 comprises a cover plate 120 attached to the top side 122 of the top plate 80. The cover plate 120 seals the top ends of the openings in the top plate 80 such that the fasteners in these openings are at vacuum pressure in the processing apparatus. However, the cover plate can be omitted by providing a vacuum seal around the openings 86, (e.g., O-rings 104 can be provided around sections containing openings 86). In FIG. 2, three O-rings provide three vacuum sealed sections each of which contains six spaced-apart openings 84.

In embodiments of the thermal control plate 58 in which the first projection 61 and second projection 63 each include O-rings 104 to provide a vacuum sealed area between the thermal control plate 58 and the top plate 80, the fasteners attaching the top plate 80 to the thermal control plate 58 can be exposed to atmospheric pressure in the processing apparatus if the tops of the bolts are not sealed.

A plurality of circumferentially-spaced alignment pins 106 are optionally provided on the flange 68 of the thermal control plate 58. The alignment pins 106 are sized to fit in alignment openings (not shown) in the top plate 80 to circumferentially and radially align the thermal control plate 58 relative to the top plate 80.

The top plate 80 preferably includes one or more gas flow passages for introducing process gas into one or more open spaces (plenums) between the top plate 80 and the thermal control plate 58. For example, the process gas can be supplied only to the control plenum above the first heater and distributed to the other plenums via passages 75. The process gas is flowed from the upper plenums through passages 78 to lower plenums, and then through the gas passages 43 in the backing plate 42 and the gas passages 23 in the inner electrode member 22. The gas passages 78 are sized to provide a desired pressure drop through the thermal control plate 58. The gas passages 78 can typically have a diameter of about 0.3 inch. The number and arrangement of the gas passages 78 is preferably selected to achieve uniform gas pressure above and across the top electrode 20 to provide uniform gas distribution into the plasma chamber. The showerhead electrode assembly 10 can optionally include baffles in the upper and/or lower plenums to control the uniformity of gas flow.

The temperature of the top plate 80 is preferably controlled by flowing heat transfer fluid (liquid or gas) through the flow passage(s) 88. The top plate 80 preferably provides an electrical ground, as well as a heat sink, for the showerhead electrode assembly 10.

As shown in FIG. 2, openings 114 are provided in the flange 68 of the thermal control plate 58 for passage of control rods of a plasma confinement assembly which can be provided outwardly of the showerhead electrode assembly 10. A suitable plasma confinement assembly including a vertically-adjustable, plasma confinement ring assembly is described in commonly-owned U.S. Pat. No. 5,534,751, which is incorporated herein by reference in its entirety.

While the invention has been described in detail with reference to specific embodiments thereof, it will be apparent to those skilled in the art that various changes and modifications can be made, and equivalents employed, without departing from the scope of the appended claims.

What is claimed is:

1. A thermal control plate for supporting a showerhead electrode in a semiconductor substrate processing chamber, comprising:
   a metal outer portion comprising an annular flange adapted to be removably attachable to a temperature-controlled top plate; and
   a metal inner portion comprising a contoured plate, the inner portion including openings to receive fasteners to removably attach the inner portion to the showerhead electrode and the top plate, the inner portion providing a thermal and electrical path between the top plate and showerhead electrode;
   a metal flexure portion comprising a cylindrical wall extending from the annular flange to the inner portion and connecting the outer portion to the inner portion, the flexure portion being configured to accommodate differential thermal expansion between the top plate and the thermal control plate; and
   at least one heater on the inner portion operable to supply heat to the showerhead electrode.

2. The thermal control plate of claim 1, wherein the contoured plate comprises an upper surface and an annular first projection on the upper surface, the first projection includes a first heat transfer surface adapted to transfer heat to the top plate, and spaced-apart annular grooves configured to receive O-rings between the top plate and the first heat transfer surface.

3. The thermal control plate of claim 2, wherein the contoured plate comprises an annular second projection on the upper surface and radially spaced from the first projection, the second projection includes a second heat transfer surface adapted to transfer heat to the top plate, and optional spaced apart annular grooves configured to receive O-rings between the top plate and the second heat transfer surface.

4. The thermal control plate of claim 1, wherein the inner portion comprises at least one thermal bridge providing a thermal and electrical path between the top plate and showerhead electrode.

5. The thermal control plate of claim 1, wherein the outer portion includes alignment pins adapted to fit in alignment openings in the top plate to provide circumferential and radial alignment between the thermal control plate and the top plate, threaded openings adapted to receive bolts extending through a bottom side of the top plate, and grooves adapted to receive O-rings between the top plate and the thermal control plate.

6. The thermal control plate of claim 1, wherein the heater comprises an inner heater section in a central zone of the contoured plate and at least one outer heater section disposed outward from the central zone of the contoured plate, the inner heater section and outer heater section being interconnected by at least one electrical connector.

7. The thermal control plate of claim 1, wherein the heater comprises a laminate including a resistive heating material between dielectric layers.

8. The thermal control plate of claim 1, wherein the heater comprises a three-phase heater.

9. The thermal control plate of claim 1, wherein the heater comprises three circuits including a first resistive heated conductor adapted to receive AC current at a first phase, a second resistive heated conductor adapted to receive AC current at a second phase, and a third resistive heated conductor adapted to receive AC current at a third phase, the first, second and third phases being 120° out of phase with each other.

10. The thermal control plate of claim 1, further comprising gas passages extending between opposite sides of the inner portion.

11. A thermal control plate for supporting a showerhead electrode in a semiconductor substrate processing chamber, comprising:
a metal outer portion adapted to be removably attachable to a temperature-controlled top plate; and
a metal inner portion connected to the outer portion by a metal flexure portion configured to accommodate differential thermal expansion between the top plate and the thermal control plate, the inner portion including openings to receive fasteners to removably attach the inner portion to the showerhead electrode and the top plate, the inner portion comprising an upper surface and at least one projection on the upper surface, the projection providing a thermal and electrical path between the top plate and showerhead electrode, wherein the outer portion, inner portion and flexure portion are a single piece of a metallic material.

12. The thermal control plate of claim 11, wherein the projection comprises spaced-apart annular grooves configured to receive an O-ring between the projection and the top plate.

13. The thermal control plate of claim 11, wherein:
the metal outer portion comprises an annular flange adapted to be removably attachable to the temperature-controlled top plate;
the metal inner portion comprises a contoured plate; and
the metal flexure portion comprises a cylindrical wall extending from the annular flange to the metal inner portion and connecting the outer portion to the inner portion.

* * * * *